United States Patent
Sevilla et al.

(10) Patent No.: US 12,374,678 B2
(45) Date of Patent: Jul. 29, 2025

(54) LITHIUM METAL SURFACE MODIFICATION USING CARBONATE PASSIVATION

(71) Applicant: Elevated Materials US LLC, Santa Clara, CA (US)

(72) Inventors: Alejandro Sevilla, Miami, FL (US); Wei-Sheng Lei, San Jose, CA (US); Girishkumar Gopalakrishnannair, San Jose, CA (US); Ezhiylmurugan Rangasamy, San Jose, CA (US); David Masayuki Ishikawa, Mountain View, CA (US); Subramanya P. Herle, Mountain View, CA (US)

(73) Assignee: Elevated Materials US LLC, Santa Clara, CA (US)

( * ) Notice: Subject to any disclaimer, the term of this patent is extended or adjusted under 35 U.S.C. 154(b) by 0 days.

(21) Appl. No.: 17/532,800

(22) Filed: Nov. 22, 2021

(65) Prior Publication Data

US 2022/0181599 A1   Jun. 9, 2022

Related U.S. Application Data

(60) Provisional application No. 63/121,013, filed on Dec. 3, 2020.

(51) Int. Cl.
*H01M 4/04* (2006.01)
*C23C 16/40* (2006.01)
(Continued)

(52) U.S. Cl.
CPC .......... *H01M 4/0428* (2013.01); *C23C 16/40* (2013.01); *C23C 16/45565* (2013.01);
(Continued)

(58) Field of Classification Search
CPC ... H01M 4/0428; H01M 4/0404; C23C 16/40; C23C 16/45565; C23C 16/50; C23C 16/56
See application file for complete search history.

(56) References Cited

U.S. PATENT DOCUMENTS 8,304,019 B1    11/2012  Pichler
8,445,137 B1 *   5/2013  Tan .................... H01M 4/134
                                                 429/231.95
(Continued)

FOREIGN PATENT DOCUMENTS

KR   20140004037 A   1/2014
KR   2020-0089233 A  7/2020
(Continued)

OTHER PUBLICATIONS

International Search Report and Written Opinion mailed Mar. 21, 2022 in International Patent Application No. PCT/US2021/060988, 9 pages.

(Continued)

*Primary Examiner* — Gordon Baldwin
*Assistant Examiner* — Christina D McClure
(74) *Attorney, Agent, or Firm* — Lee & Hayes, P.C.

(57) ABSTRACT

Exemplary processing methods may include translating a lithium film beneath a first showerhead. The methods may include introducing an oxidizer gas through the first showerhead onto the lithium film. The methods may include forming an oxide monolayer on the lithium film. The oxide monolayer may be or include the oxidizer gas adsorbed on the lithium film. The methods may include translating the lithium film beneath a second showerhead after forming the oxide monolayer. The methods may include introducing a carbon source gas through the first showerhead onto the lithium film. The methods may also include converting the (Continued)

oxide monolayer into a carbonate passivation layer through reaction of the oxide monolayer with the carbon source gas.

16 Claims, 6 Drawing Sheets

(51) Int. Cl.
    *C23C 16/455*     (2006.01)
    *C23C 16/50*     (2006.01)
    *C23C 16/56*     (2006.01)

(52) U.S. Cl.
    CPC .............. *C23C 16/50* (2013.01); *C23C 16/56* (2013.01); *H01M 4/0404* (2013.01)

(56) References Cited

U.S. PATENT DOCUMENTS

| | | | |
|---|---|---|---|
| RE47,325 E * | 3/2019 | Nilsen | C23C 16/409 |
| 2007/0224348 A1 | 9/2007 | Dickey et al. | |
| 2008/0139003 A1 | 6/2008 | Pirzada et al. | |
| 2011/0041765 A1 * | 2/2011 | Fujinami | C23C 16/45519 |
| | | | 118/719 |
| 2014/0212600 A1 * | 7/2014 | Neil | C23C 16/45517 |
| | | | 118/718 |
| 2015/0001519 A1 * | 1/2015 | Matsuura | H01L 33/405 |
| | | | 257/734 |
| 2015/0096495 A1 * | 4/2015 | Jeong | C23C 16/52 |
| | | | 118/729 |
| 2015/0293371 A1 * | 10/2015 | Song | G02B 27/4233 |
| | | | 118/35 |
| 2015/0299848 A1 * | 10/2015 | Haukka | C23C 16/407 |
| | | | 427/256 |
| 2016/0133831 A1 * | 5/2016 | Kim | C23C 14/185 |
| | | | 204/192.15 |
| 2017/0141295 A1 | 5/2017 | Ekerdt et al. | |
| 2019/0058177 A1 * | 2/2019 | Herle | H01M 50/489 |
| 2019/0088987 A1 * | 3/2019 | Herle | H01M 10/0525 |
| 2019/0260066 A1 * | 8/2019 | Hu | H01M 50/426 |
| 2019/0287807 A1 | 9/2019 | Basu et al. | |
| 2020/0176754 A1 * | 6/2020 | Lho | H01M 10/0525 |
| 2020/0235385 A1 * | 7/2020 | Kim | H01M 4/665 |
| 2020/0407841 A1 * | 12/2020 | Gibo | H01M 4/0423 |
| 2021/0050593 A1 * | 2/2021 | Brewer | H01M 4/60 |

FOREIGN PATENT DOCUMENTS

| | | | |
|---|---|---|---|
| WO | 2019-057274 A1 | 3/2019 | |
| WO | WO-2019156005 A1 * | 8/2019 | ............. C23C 14/16 |

OTHER PUBLICATIONS

Office Action for Korean Application No. 10-2023-7022243, dated May 22, 2025, 18 pages.
Office Action for Japanese Application No. 2023-533600, dated Apr. 22, 2025, 6 pages.

\* cited by examiner

LITHIUM METAL SURFACE MODIFICATION USING CARBONATE PASSIVATION

CROSS-REFERENCE TO RELATED APPLICATIONS

This application claims the benefit of, and priority to U.S. Provisional Application Ser. No. 63/121,013, filed Dec. 3, 2020, which is hereby incorporated by reference in its entirety for all purposes.

TECHNICAL FIELD

The present technology relates to thin film deposition processes and chamber components. More specifically, the present technology relates to modified components and deposition methods.

BACKGROUND

Thin-layer batteries are made possible by processes which produce thin material layers on substrate surfaces. Producing thin material layers on a substrate requires controlled methods of formation on large area substrates. As device sizes continue to shrink, multilayer batteries incorporate increasingly thin metal layers, which are susceptible to oxidation during battery fabrication, and are susceptible to degradation during operation, such as by dendrite formation. To protect against such degradation, passivation layers may be deposited onto thin material layers as part of deposition methods. During deposition of passivation layers, precursor gases may contaminate processing chamber, which may affect device quality.

Thus, there is a need for improved systems and methods that can be used to produce high quality devices and structures. These and other needs are addressed by the present technology.

SUMMARY

Exemplary processing methods may include translating a lithium film beneath a first showerhead. The methods may include introducing an oxidizer gas through the first showerhead onto the lithium film. The methods may include forming an oxide monolayer on the lithium film. The oxide monolayer may be or include the oxidizer gas adsorbed on the lithium film. The methods may include translating the lithium film beneath a second showerhead after forming the oxide monolayer. The methods may include introducing a carbon source gas through the first showerhead onto the lithium film. The methods may also include converting the oxide monolayer into a carbonate passivation layer through reaction of the oxide monolayer with the carbon source gas.

In some embodiments, the lithium film may be supported on a conductive substrate held under tension between two tensioning elements of a film deposition system. The processing methods may further include depositing lithium onto the conductive substrate and planarizing the deposited lithium. The first showerhead may include a first plurality of showerhead units oriented along a first axis. The second showerhead may include a second plurality of showerhead units oriented parallel to the first axis and offset from the first showerhead by a first distance. The processing methods may further include translating the lithium film beneath the first showerhead includes motion perpendicular to the first axis. The first showerhead and the second showerhead each may include a plurality of inlets and a plurality of outlets in an arrangement. The plurality of outlets may be positioned to remove excess gas from a region between the plurality of outlets and the lithium film. The orientation of the plurality of outlets may define a flow pattern limiting excess gas flow parallel to the lithium film external to the region. The processing methods may further include forming a pattern in a surface of the lithium film. The pattern may define a plurality of recesses in the surface of the lithium film. The processing methods may further include forming a pattern in the carbonate passivation layer, the pattern defining a plurality of recesses in the carbonate passivation layer, wherein the plurality of recesses reveal a surface of the lithium film.

Some embodiments of the present technology may encompass processing methods. The methods may include forming an oxide monolayer on a metal film, the oxide monolayer comprising an oxidizer gas adsorbed on the lithium film. The methods may include converting the oxide monolayer into a carbonate passivation layer through reaction of the oxide monolayer with a carbon source gas. The methods may also include patterning the metal film with a pattern defining a plurality of recesses.

In some embodiments, patterning the metal film may include depositing a substrate layer onto a current collector, forming the pattern in the substrate layer, and depositing the metal film on the substrate layer. Forming the pattern in the substrate layer may include ablating the substrate layer with a laser. The pattern may be formed on the metal film after converting the oxide monolayer into the carbonate passivation layer. The plurality of recesses may be defined in the carbonate passivation layer. The pattern may define the plurality of recesses in the carbonate passivation layer. The plurality of recesses may reveal a surface of the metal film. Patterning the metal film may include emitting a light beam from a coherent light source. Patterning the metal film may include receiving the light beam by a diffractive optical element. The diffractive optical element may be configured to shape and redirect the light beam toward the metal film. Patterning the metal film may also include irradiating the metal film at a plurality of positions corresponding to the pattern. Patterning the metal film may include advancing the metal film between two or more rollers. A first roller of the two of more rollers may be or include a micro-needle array. The micro-needle array may be configured to transfer the pattern into the metal film. A second roller of the two or more rollers may support the metal film against the first roller.

Some embodiments of the present technology may encompass passivation systems. The systems may include a plurality of rollers. The rollers may be configured to hold a conductive substrate under tension while the conductive substrate advances across a span between two rollers of the plurality of rollers. The systems may include a first showerhead, positioned within the span and configured to provide a first gas to the conductive substrate. The systems may also include a second showerhead, positioned within the span and configured to provide a second gas to the conductive substrate. The first showerhead and the second showerhead may be aligned with a plane parallel to a plane between the two rollers. Each showerhead may define a flow pattern substantially maintaining delivered gas within a region between the showerhead and the conductive substrate.

In some embodiments, the first showerhead and the second showerhead each may include a plurality of inlets and a plurality of outlets in an arrangement, wherein the plurality of outlets are positioned to remove excess gas from a region between the plurality of outlets and the lithium film, and wherein the orientation of the plurality of outlets defines the flow pattern. The plurality of inlets and the plurality of outlets may be equal in number. The first showerhead and the second showerhead may each include a gas inlet configured to receive a gas from a gas supply system. The first showerhead and the second showerhead may each include a top plate. The top plate may include a plurality of conduits, in communication with the gas inlet. The first showerhead and the second showerhead may each include a bottom plate. The bottom plate may include the plurality of inlets and the plurality of outlets. The plurality of inlets may communicate with the plurality of conduits. The first showerhead and the second showerhead may each also include a gas outlet in communication with the plurality of outlets and configured to send the excess gas to a gas exhaust system. The first showerhead and the second showerhead each may include a heated baffle. The first showerhead may include a first plurality of showerhead units oriented along a first axis. The second showerhead may include a second plurality of showerhead units oriented parallel to the first axis and offset from the first showerhead by a first distance.

Such technology may provide numerous benefits over conventional systems and techniques. For example, the systems may provide a passivated thin film for incorporation in a multilayer battery. In this way, the operations of embodiments of the present technology may produce improved thin film coatings, as may be incorporated into battery devices exhibiting improved battery performance and increased battery lifetime. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
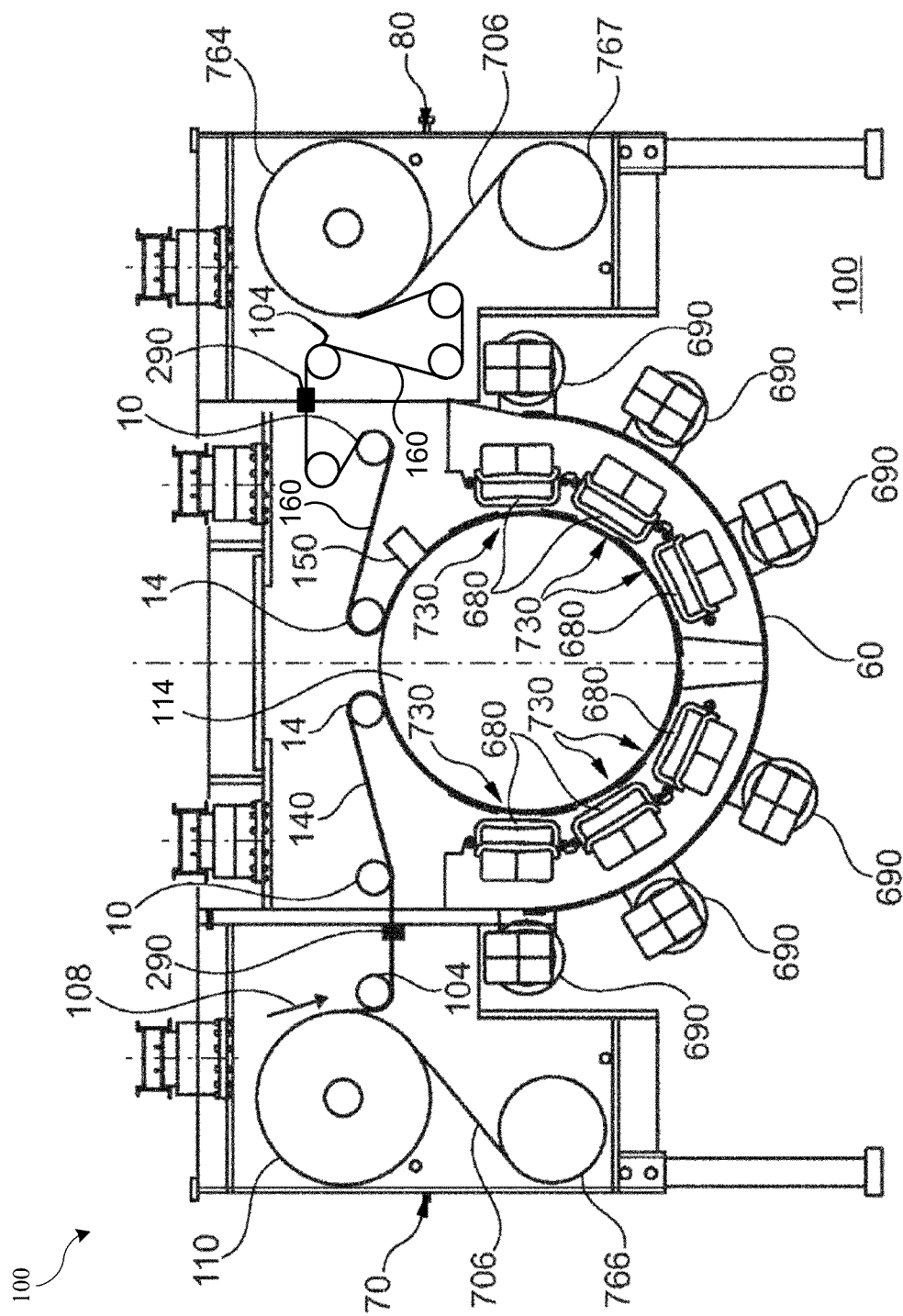
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In roll-to-roll fabrication processes, such as of metal or other multilayer materials, surface passivation may include introducing one or more precursor gases into a region between a showerhead or gas distributor and a substrate support. As precursors are interact, deposition materials may form a passivation layer on the substrate. Where the precursor gases form by a surface-mediated reaction, any surface exposed to the gases may develop a passivation layer. In this way, controlling contamination of roll-to-roll deposition systems with precursor gases becomes important. Furthermore, passivation layers may limit the effectiveness of multi-layer materials to act as conductors, and as such the multilayer materials may incorporate patterns, formed by processes such as pressing, stamping, or rolling.

Conventional technology has approached these limitations through separating passivation processes from roll-to-roll deposition units, which may include multiple complex transfer operations to move a roll from one unit to another. Furthermore, mechanical approaches to patterning present increased risk of contamination and damage to multilayer films, especially as films decrease in thickness as roll-to-roll fabrication technology develops. The present technology may overcome these limitations by integrating passivation into a roll-to-roll deposition system using gas supply systems that define a flow pattern where substantially negligible volumes of precursor gases leave a region between a substrate and the gas supply systems. Furthermore, the present technology may overcome limitations on the passivation system by introducing a patterning process into the roll-to-roll deposition system. In this way, the substrate and/or the passivation layer is patterned. For example, a first precursor gas may be adsorbed onto a surface of a metal film as a monolayer, provided by a showerhead configured to recapture substantially all of the first precursor gas. Subsequent the provision of the first precursor gas, a second precursor gas may be provided by a second showerhead similarly configured to recapture all of the first precursor gas. This may permit the second precursor gas to react with the adsorbed monolayer of the first precursor gas to form a passivation layer, while maintaining a substantially negligible presence of either the first precursor gas or the second precursor gas in the roll-to-roll deposition system. Preceding or subsequent the formation of the passivation layer, the substrate may be patterned by one or more methods including, but not limited to, laser patterning or impressing using a laser-machined roller to define an array of recesses in the surface of the substrate and/or the passivation layer. After describing general aspects of a chamber according to embodiments of the present technology in which deposition and patterning may be performed, specific methodology and component configurations may be discussed. It is to be understood that the present technology is not intended to be limited to the specific films and processing discussed, as the techniques described may be used to improve a number of film formation processes, and may be applicable to a variety of processing chambers and operations.

FIG. 1 shows a cross-sectional view of an exemplary processing chamber 100 according to some embodiments of the present technology. A further exemplary embodiment shall be discussed with reference to the illustration of FIG. 1. This figure illustratively represents various possible embodiments of a flexible substrate coating apparatus 100.

The terms "coating" and "deposition" are used synonymously herein. Not limited to this embodiment, the flexible substrate coating apparatus may generally be configured to house the substrate storage spool 110, as it is illustrated in the embodiment of FIG. 1. According to some embodiments, which can be combined with other embodiments described herein, the flexible substrate 140 to be processed can be provided on the storage spool 110. The storage spool may be placed in a separate spool chamber 70. It is also possible that an interleaf 706 is provided between the adjacent layers of the flexible substrate 140 such that direct contact of one layer of the flexible substrate 140 with an adjacent layer of the flexible substrate 140 on the storage spool 110 may be reduced.

In operation, the flexible substrate 140 may be unwound from the storage spool 110 as indicated by the substrate movement direction shown by arrow 108. Upon unwinding of the flexible substrate 140 from the storage spool 110, if present, the interleaf 706 may be wound on the interleaf roll 766. The flexible substrate 140 may be guided via one or more guide rollers 104. The flexible substrate 140 may also be guided by one or more substrate guide control units 10 controlling the run of the flexible substrate 140, for example, by fine adjusting the orientation of the flexible substrate 140.

In the vacuum process chamber 60, a coating drum 114 may be provided. After uncoiling from the flexible substrate 140 storage spool 110 and running over the guide roller 104 and the flexible substrate 140 guide control unit 10, the flexible substrate 140 may be translated through the processing regions 730 provided at the coating drum 114 and corresponding to positions of the deposition units 680. During operation, the coating drum 114 rotates such that the flexible substrate 140 is translated in the direction of arrow 108.

Following deposition by the deposition units 680, the flexible substrate 140 is cleaned by the cleaning unit 150. Thereby, and not limited to any embodiment, the cleaning unit 150 is typically positioned in the vacuum process chamber 60. In particular, and not limited to the present embodiment, the cleaning unit may be positioned such that it acts on the flexible substrate 140 when the flexible substrate 140 is still positioned on the drum. Cleaning can thus be a process step that is performed in a process section of the coating drum. Advantageously, this may provide a defined contact pressure of the cleaning unit against the flexible substrate 140. Alternatively, it is also possible that the cleaning unit may be positioned in the free span of the flexible substrate 140 between the coating drum and the next guide roller. In this way, it is also possible that two cleaning units are provided wherein each cleaning unit is positioned on each side of the flexible substrate 140.

In the illustration of FIG. 1, the flexible substrate 140 may be cleaned by the cleaning unit 150 directly after running through the last deposition process and still on the coating drum. In addition, the flexible substrate 140 may be cleaned before it comes into contact with the deflection roller 14. In other words the design of the flexible substrate coating apparatus may include the cleaning unit as the first element in the flexible substrate coating apparatus that touches the coated side of the flexible substrate 140 downstream of the deposition process. In this way, substrate damages as described previously may be substantially reduced when the substrate is contacted by a deflection roller. Where the particulate contaminants are present on the substrate, contact with the deflection roller 14 may press the dirt into the substrate. This may carve the footprint of the particle into the substrate leading to pinholes or the like.

The vacuum process chamber 60 may be maintained under high vacuum for optimizing the deposition quality and reducing contamination by foreign particles in the deposited layer. In particular, deposition apparatuses with e.g. CVD, PECVD and/or PVD sources, may use different residues from gas mixtures. Contamination with unknown or undesired evaporation from a cleaning unit may inhibit the long term stability of the deposition process. After being cleaned by the cleaning unit 150, the flexible substrate 140 may run over one or more deflection rollers 14. The one or more deflection rollers 14 downstream of the coating unit and the cleaning unit may also serve as tensioning units that allow the substrate to have a different tension during the deposition than during winding of the flexible substrate 140.

Furthermore, the flexible substrate 140 may run over one or more flexible substrate 140 guide control units 10 and further rolls, such as guide roller 104 depicted in FIG. 1. As the flexible substrate 140 coating in the embodiment of FIG. 1 is accomplished at that position, the flexible substrate 140 is wound up on a spool 764. A further interleaf 706 may be provided from interleaf roll 767 between the layers of the flexible substrate 140 so as to reduce damage to the web.

The flexible substrate 140 may be coated with one or more thin films. For example, one or more layers may be deposited on the flexible substrate 140 by the deposition units 680. The deposition takes place while the substrate is guided on the coating drum 114. As many as three, four, five, or more deposition units may be provided that may be arranged around the coating drum 114. Each deposition unit 680 may be connected to a corresponding control and/or power provision unit 690.

Embodiments described herein refer inter alia to a plasma deposition system for depositing, from a plasma phase, thin films onto a moving substrate. The flexible substrate 140 may move in a substrate transport direction in a vacuum process chamber where a plasma deposition unit is located for transferring a deposition gas into a plasma phase and for depositing, from the plasma phase, a thin film onto the moving substrate. Consequently, also cleaning may be undertaken at the moving flexible substrate 140.

As shown in FIG. 1 one or more plasma deposition units, such as deposition unit 680, may be provided as a PECVD (plasma-enhanced chemical vapor deposition) source having a multi-region electrode device including two, three or even more RF (radio frequency) electrodes arranged opposite to the moving flexible substrate 140. According to embodiments, multi region plasma deposition units can also be provided for MF (middle frequency) deposition.

Generally, the one or more deposition units as described herein can be selected from the group consisting of a CVD source, a PECVD source and a PVD source. The one or more deposition units can be a sputter source, such as, a magnetron sputter source, DC sputter source, AC sputter source, pulsed sputter source, radio frequency (RF) sputtering, or middle frequency (MF) sputtering can be provided. For instance, MF sputtering with frequencies in the range of 5 kHz to 100 kHz, for example, 30 kHz to 50 kHz, can be provided. According to typical implementations, the flexible substrate coating apparatuses can be used for manufacturing flexible TFT displays, and particularly for barrier layer stacks for flexible TFT displays.

In the embodiment shown, by running over the coating drum 114, the flexible substrate 140 may pass through two or more processing regions 730 that are arranged facing deposition units 680, such as the sputter source or evaporation source, as illustrated in FIG. 1. The flexible substrate coating apparatus may include more than one coating unit, such as more than one coating drum 114. The flexible substrate 140 may be coated with one or more thin films, whereby one or more layers may be deposited on the flexible substrate 140 by deposition units 680. The deposition may occur while the flexible substrate 140 is guided on the coating drum 114. The flexible substrate 140 guide control unit may be provided on one side or on both sides of the coating drum. The flexible substrate 140 guide control unit may be configured for measuring and adjusting the tension of the web. In this way, the flexible substrate 140 transport may be better controlled, the pressure of the substrate on the coating drum may be controlled and/or damage to the substrate may be reduced.

As illustrated in FIG. 1, the flexible substrate coating apparatus may include one or more seals, such as seals 290 in FIG. 1. The seals may be static seals. The seals may provide a pressure separation between the vacuum process chamber 60, which includes the coating drum 114, and the spool chambers 70 and 80, in which flexible substrate 140 guiding, flexible substrate 140 winding and/or flexible substrate 140 unwinding may be performed. Such a set-up reduces the complexity of replacing a spool 764 after it has been completely coated. In particular, it allows the vacuum process chamber 60 to be maintained at medium/high vacuum conditions while having ambient pressure or low vacuum in the flexible substrate 140 handling chamber. Notably, the one or more seals may generally be also dynamic seals, for example, seals that can be operated during movement of the web.

The flexible substrate coating apparatus 100 may include guide rollers 104 internal to the vacuum process chamber 60 or the spool chambers 70 and 80, where the guide rollers define one or more spans 160. The spans 160 may provide a space for introducing additional coating and processing units, as described in reference to FIGS. 2-6, below. For example, a span 160 within the vacuum process chamber 60 or the spool chambers 70 and 80 may permit the integration of a deposition unit wherein the flexible substrate 140 may be translated beneath one or more gas showerheads, as described in reference to FIGS. 2-4. In another example, a span 160 may permit the integration of a patterning unit wherein a pattern may be introduced into a surface of the flexible substrate 140, for example, by optical patterning or mechanical patterning. In some embodiments, the flexible substrate 140 may be electrically conductive.

Figure 2:
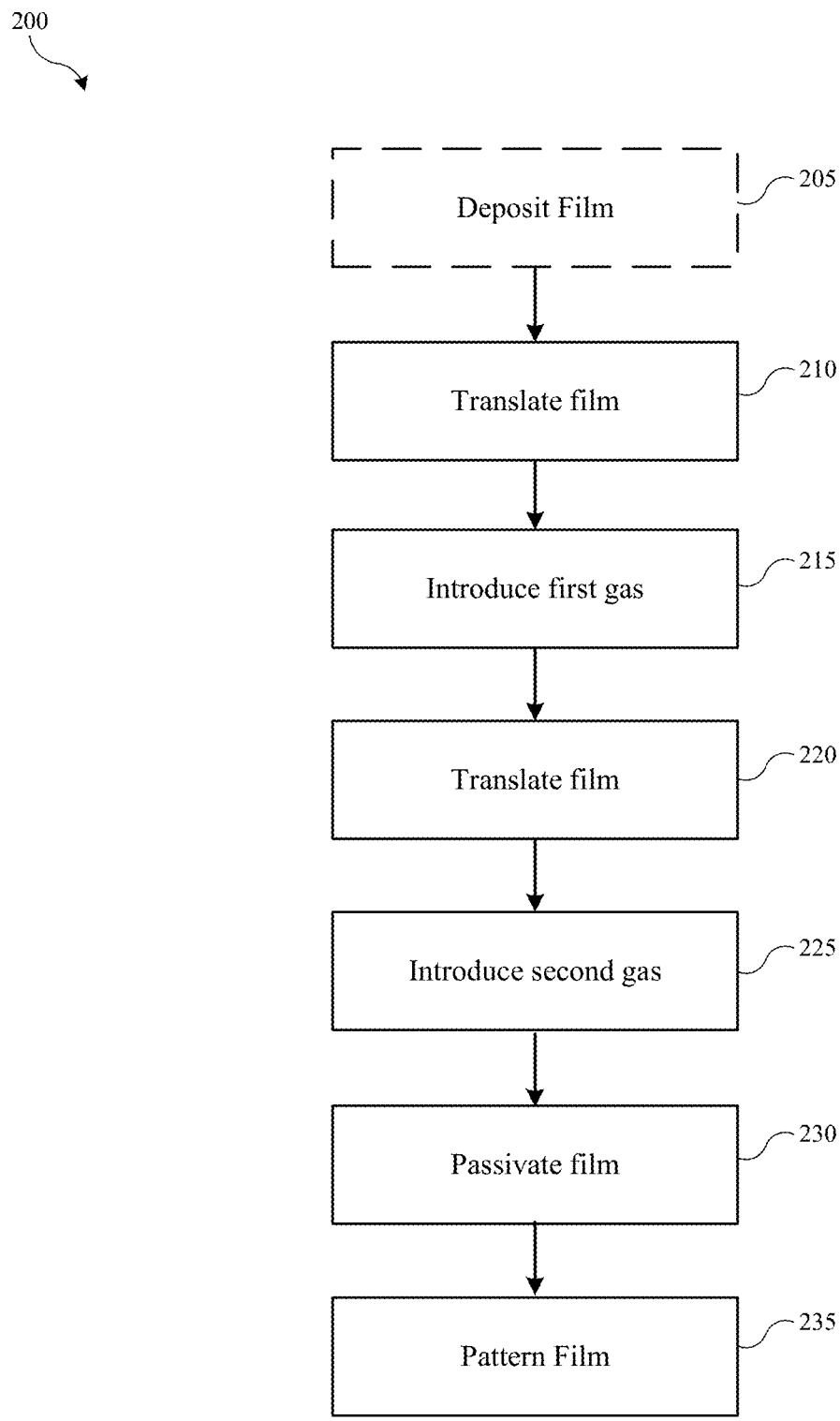
FIG. 2 shows exemplary operations in a deposition method according to some embodiments of the present technology.

FIG. 2 shows exemplary operations in a deposition method 200 according to some embodiments of the present technology. The method may be performed in a variety of processing chambers, including processing chamber 100 described above. Additional aspects of processing chamber 100 will be described further below. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 200 may include additional operations prior to initiation of the listed operations. For example, additional processing operations may include forming structures on a flexible and/or conductive substrate, which may include both forming and removing material. Prior processing operations may be performed in the chamber in which method 200 may be performed, or processing may be performed in one or more other processing chambers prior to delivering the substrate into the substrate processing chamber in which method 200 may be performed. Regardless, method 200 may optionally include delivering a substrate to a processing volume of a vacuum processing chamber, such as processing chamber 100 described above, or other chambers that may include components as described above. Method 200 describes operations shown schematically in FIGS. 3A-3C, the illustrations of which will be described in conjunction with the operations of method 200. It is to be understood that FIG. 3 illustrates only partial schematic views, and a processing system may include subsystems as illustrated in the figures, as well as alternative subsystems, of any size or configuration that may still benefit from aspects of the present technology.

Figure 3A:
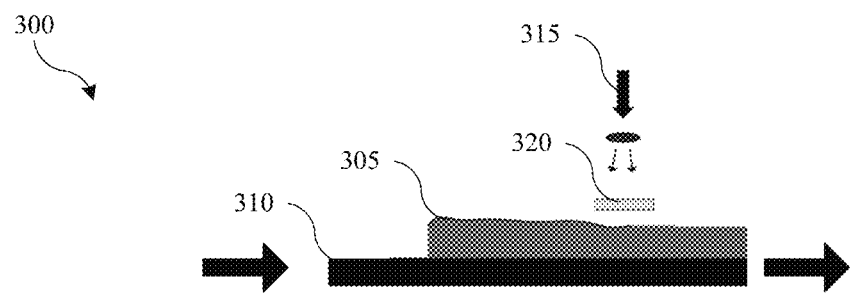
FIGS. 3A-3C show schematic views of an exemplary deposition system during operations in a deposition method according to some embodiments of the present technology.
Figure 3B:
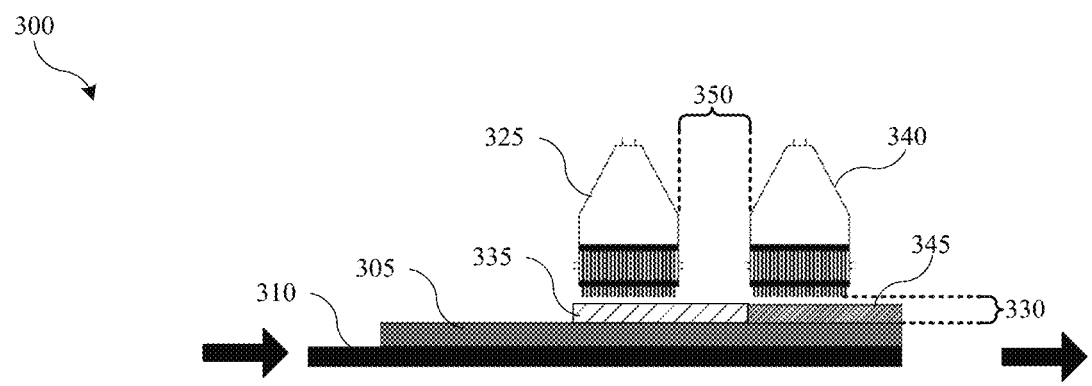
Figure 3C:
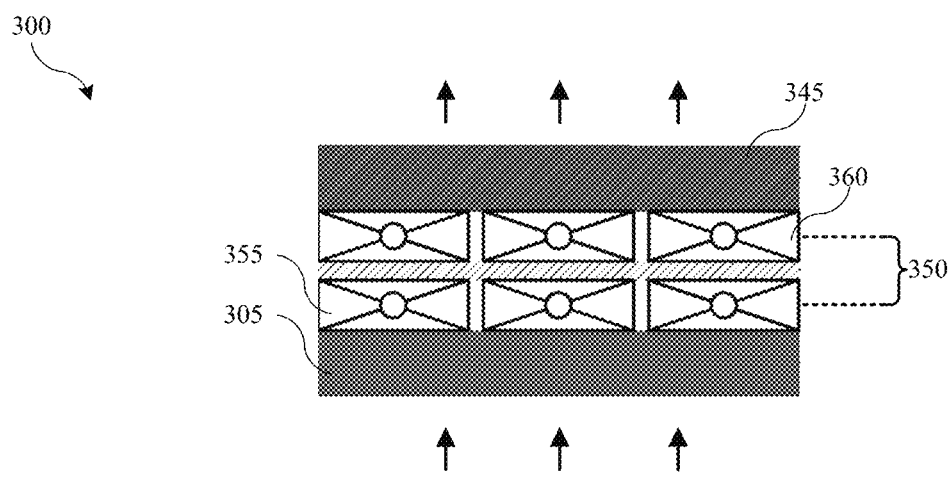

FIGS. 3A-3C show schematic views of an exemplary processing system during operations in a processing method according to some embodiments of the present technology. FIGS. 3A-3C may illustrate further details relating to components in chamber 100. System 300 is understood to include any feature or aspect of chamber 100 discussed previously in some embodiments. The system 300 may be used to perform roll-to-roll coating of substrate films. System 300 may show a partial view of the chamber components being discussed and that may be incorporated in a flexible substrate coating system, and may illustrate a view of a flexible substrate between two rollers, which may otherwise be of any size. Any aspect of system 300 may also be incorporated with other processing chambers or systems as will be readily understood by the skilled artisan.

At operation 205, as illustrated in FIG. 3A, deposition procedures may optionally include depositing a material film 305 overlying a conductive substrate 310, which may be an example of the flexible substrate 140 of FIG. 1. The material film 305 may be or include a metal that is suitable for application in thin film structures including, but not limited to, multi-layer batteries, transparent electrodes, optically active films, or other functional thin film materials. In an illustrative example, the material film 305 may be or include lithium metal, which may be deposited by methods compatible with the chamber 100, as described in more detail in reference to FIG. 1, above. For example, lithium metal may be deposited onto the conductive substrate 310 by thermal evaporation. In some embodiments, for example, where the material film 305, as deposited, includes surface features exceeding a threshold uniformity for application in subsequent operations of the method 200. In this way, operation 205 may further include planarization of the material film 305. Planarization may include, but is not limited to, any method compatible with the chamber 100 and that may be integrated into a roll-to-roll fabrication system. For example, a laser planarization approach may be applied to reduce the characteristic dimensions of the surface features of the material film 305. Laser planarization may include directing a laser beam 315 toward the surface of the material film 305. The laser beam 315 may be or include an infrared laser beam that is pulsed at high frequency, for example, with a pulse period on the order of picoseconds or on the order of femtoseconds. The laser beam 315 may be or include a visible laser beam with a frequency on the order of MHz. In some embodiments, the laser beam 315 may be focused onto the surface of the material film 305 through a transparent plate 320 and scanned across a surface of the material film 305. The transparent plate 320 may serve to contain a laser-induced plasma between the surface of the material film 305 and the transparent plate 320, such that the plasma includes a vapor of the material film 305 that may redeposit onto the surface of the material film 305 as the laser beam 315 scans. In this way, the laser beam 315 may progressively planarize the material film 305 over a number of scans, for example, as the conductive substrate 310 may be translated beneath the position of the laser beam 315.

In some embodiments, method 200 may include translating the material film 305 beneath a first showerhead 325 at operation 210. The first showerhead 325 may be integrated into a processing chamber, such as the chamber 100, such that it is positioned within a span across which the conductive substrate 310 advances, for example, between two guide rollers 104 of FIG. 1. The conductive substrate 310 may advance past the first showerhead and carry with it the material film 305. In this way, the material film 305 may translate beneath the first showerhead at a distance between the surface of the material film 305 and a proximal surface of the first showerhead 325, at a rate equivalent to the advancing speed of the conductive substrate 310. Furthermore, the distance 330 may define a region between the first showerhead 325 and the surface of the material film 305. As described in more detail in reference to FIG. 4A-4C, below, the first showerhead 325 may include internal structures defining a flow pattern that substantially maintains a delivered gas within the region between the showerhead and the conductive substrate. In some embodiments, the span within which the first showerhead is positioned may be oriented substantially vertically, substantially horizontally, or any angle between, such that when the material film 305 is translated beneath the first showerhead, the term "beneath" denotes facing the proximal surface of the first showerhead 325, rather than any particular orientation of the showerhead.

In some embodiments, method 200 may include introducing a first gas through the first showerhead 325, at operation 215. The first gas may be or include an oxidizer gas, including, but not limited to, diatomic oxygen, water vapor, or another gas selected for a surface binding energy that provides an adsorbed monolayer on the surface of the material film 305 and that reacts with a carbon source to form a carbonate. As described above, the first showerhead 325 may include internal structures enabling the first showerhead 325 to provide the first gas according to flow pattern limiting excess gas flow parallel to the lithium film external to the region between the material film 305 and the proximal surface of the first showerhead 325. In some embodiments, the first gas may be or include an inert gas as well as an oxidizer gas. For example, the first gas may be or include a mixture of an inert carrier gas and an oxidizer, where the oxidizer is present in the inert carrier gas at a concentration of greater than or about 0.5 ppm, greater than or about 1.0 ppm, greater than or about 1.5 ppm, greater than or about 2.0 ppm, greater than or about 2.5 ppm, greater than or about 3.0 ppm, greater than or about 3.5 ppm, greater than or about 4.0 ppm, greater than or about 4.5 ppm, greater than or about 5.0 ppm, greater than or about 5.5 ppm, greater than or about 6.0 ppm, greater than or about 6.5 ppm, greater than or about 7.0 ppm, or greater. The inert carrier gas flowrate may be selected such that the oxidizer is provided at a flowrate below 0.1 sccm. The inert carrier gas may be or include argon and may be provided to the first showerhead at a flowrate greater than or about 1 slm, greater than or about 10 slm, greater than or about 20 slm, greater than or about 30 slm, greater than or about 40 slm, greater than or about 50 slm, greater than or about 60 slm, greater than or about 70 slm, greater than or about 80 slm, greater than or about 90 slm, greater than or about 100 slm, greater than or about 110 slm, greater than or about 120 slm, or greater.

Figure 4A:
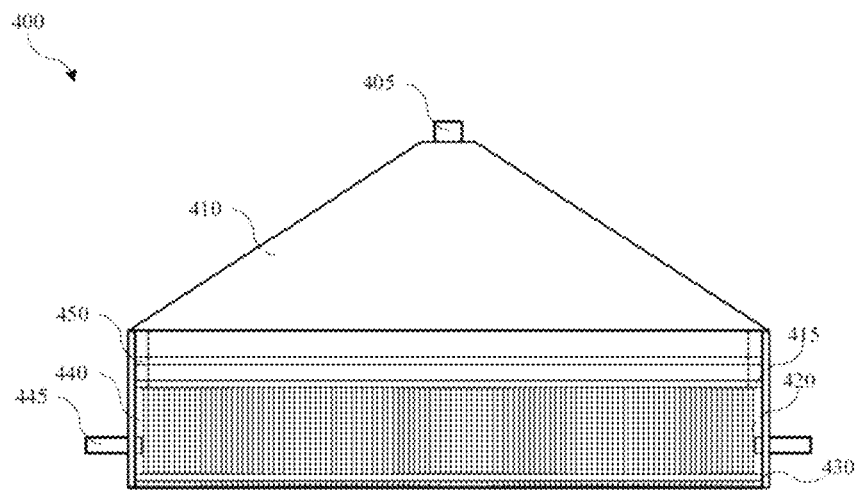
FIGS. 4A-4C show schematic views of an exemplary deposition system according to some embodiments of the present technology.
Figure 4B:
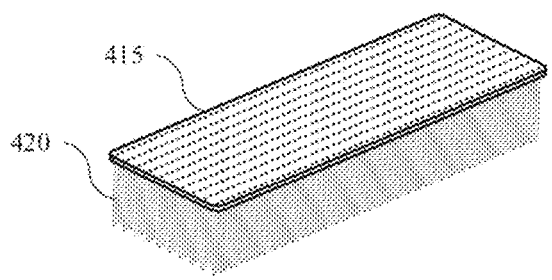
Figure 4C:
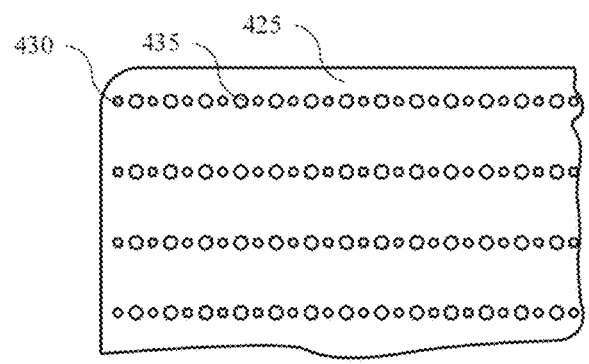

An illustrative embodiment of the first showerhead 325 is provided in FIG. 4A-C. In some embodiments, a showerhead 400 may include internal structures permitting the showerhead to provide the first gas to the material film 305 according to the flow pattern. As illustrated in FIG. 4A, the showerhead 400 may include a gas inlet 405, that may be connected to a gas supply. The gas supply may include one or more gas manifold elements that permit the showerhead 400 to provide the first gas at a controlled oxygen composition. For example, the gas supply may include an inert gas supply, an oxygen gas supply, as well as a water vapor supply, such as a water bubbler that may be deoxygenated, for example, by scrubbing a water reservoir with an inert gas. The showerhead 400 may include an entry plenum 410 configured to provide the first gas to a top plate 415. The top plate 415, illustrated in FIG. 4B, may be provided with an array of conduits 420 to extend between the top plate 415 and a bottom plate 425. The bottom plate 425 may include an array of inlets 430 and an array of outlets 435. The conduits 420 may extend through the inlets 430, to a distance beyond a surface of the bottom plate 425. The surface of the bottom plate 425, with the conduits 420, may define a proximal surface of the showerhead 400, for example, defined in relation to a conductive substrate, as when the showerhead 400 is integrated in a roll-to-roll processing system, such as the chamber 100 of FIG. 1.

As illustrated, the array of outlets 435 may communicate with an exhaust plenum 440 internal to the showerhead 400. The exhaust plenum 440 may be configured to operate at reduced pressure relative to region rear the proximal surface of the showerhead 400, provided by an outlet 445 communicating with an exhaust system. In this way, during operation 215, the first gas may be provided through the conduits 420 and may be recaptured by the exhaust plenum 440 via the outlets 435 of the bottom plate 425. In some embodiments, the bottom plate 425 may include an equal number of inlets 430 and outlets 435. The relative number of inlets 430 and outlets 435 may differ for example, based on operating parameters giving rise to a flow pattern defined by the showerhead 400. In general, the arrangement of inlets and outlets may be specified to define a flow pattern of a gas delivered through the conduits that substantially maintains the delivered gas within a region between the showerhead 400 and the conductive substrate 310. For example, the delivered gas may be limited from flowing parallel to the conductive substrate 310 external to the region between the showerhead 400 and the conductive substrate 310.

In some embodiments, the showerhead 400 may include a heated baffle 450. The heated baffle may be configured to raise the temperature of the gas provided through the conduits 420. For example, adsorption dynamics of a gas may be temperature dependent. In this way, the heated baffle 450 may permit the showerhead to provide a gas at a controlled temperature to a surface of the material film 305. The controlled temperature may be defined to promote the formation of a monolayer 335, as opposed to other forms of adsorption, such as multi-layer adsorption or unsaturated surface adsorption.

Subsequent introducing the first gas through the first showerhead 325, method 200 may include translating the material film 305 beneath a second showerhead 340, at operation 220. As described in reference to operation 210, the second showerhead 340 may be positioned within a span across which the conductive substrate 310 advances between two rollers of a roll-to-roll processing system. The second showerhead 340 may be positioned a distance 350 from the first showerhead 325 in the direction of travel of the conductive substrate 310. The distance 350 between the first showerhead 325 and the second showerhead 340 may correspond to a time, relative to the advancement rate of the conductive substrate 310, such that the monolayer 335 reaches an equilibrium. Translating the material film 305 beneath the second showerhead 340 may also provide a residence time beneath the second showerhead 340 that may be coupled with gas-flow parameters of the second showerhead. In this way, the operation of the second showerhead may be controlled to provide a chemical reaction between a second gas and the monolayer 335.

As illustrated in FIG. 3C, the first showerhead 325 may include a number of first showerhead units 355. Each of the first showerhead units 355 may include the internal structures described in reference to FIGS. 4A-4C, and may be oriented along an axis that is perpendicular to the direction of advancement of the conductive substrate 310. In this way, the first showerhead 325 may be modular and scalable to treat different widths of the conductive substrate 310. Similarly, the second showerhead 340 may include a number of second showerhead units 360. The second showerhead units 360 may be oriented parallel to the axis and offset from the first showerhead by the distance 350. In this way, translating the material film 305 may include advancing the conductive substrate 310, bearing the material film 305, beneath the first showerhead units 355 and subsequently the second showerhead units 360, in a direction perpendicular to the axis of alignment of the first showerhead units 355 and the second showerhead units 360.

In some embodiments, method 200 may include introducing a second gas through the second showerhead 340, at operation 225. Operation 225 may be implemented concurrently with operation 220, such that the second gas is provided to the material film 305 while the material film 305 is translated beneath the second showerhead 340. As described in more detail in reference to operation 215, the second gas may be provided through the second showerhead 340 at a controlled temperature, and may be provided according to a flow pattern defined by the second showerhead, resulting from the arrangement of inlets and outlets in the second showerhead 340. The second gas may be or include a carbon source gas that is selected to react with the monolayer 335 to form a passivation layer 345. For example, the second gas may be or include carbon dioxide. The second gas may include carbon dioxide and an inert carrier gas. The second gas may include carbon dioxide at greater than or about 1% Vol, greater than or about 5% Vol, greater than or about 10% Vol, greater than or about 20% Vol, greater than or about 30% Vol, greater than or about 40% Vol, greater than or about 50% Vol, greater than or about 60% Vol, greater than or about 70% Vol, greater than or about 80% Vol, greater than or about 90% Vol, greater than or about 95% Vol, or greater. The inert carrier gas may be or include argon or nitrogen.

Subsequent or concurrent introducing the second gas through the second showerhead 340, method 200 may include passivating the material film 305, at operation 230. As described above, passivating the material film 305 may describe a process by which the monolayer 335, including oxygen species, reacts with the second gas to form the passivation layer 345. The passivation layer may be or include a carbonate formed from the material film 305. For example, where the material film is or includes lithium metal, the passivation layer 345 may be or include lithium carbonate. The passivation of operation 230 may include a heterogeneous reaction at the surface of the material film 305 that converts the monolayer 335 into the passivation layer 345.

Figure 5A:
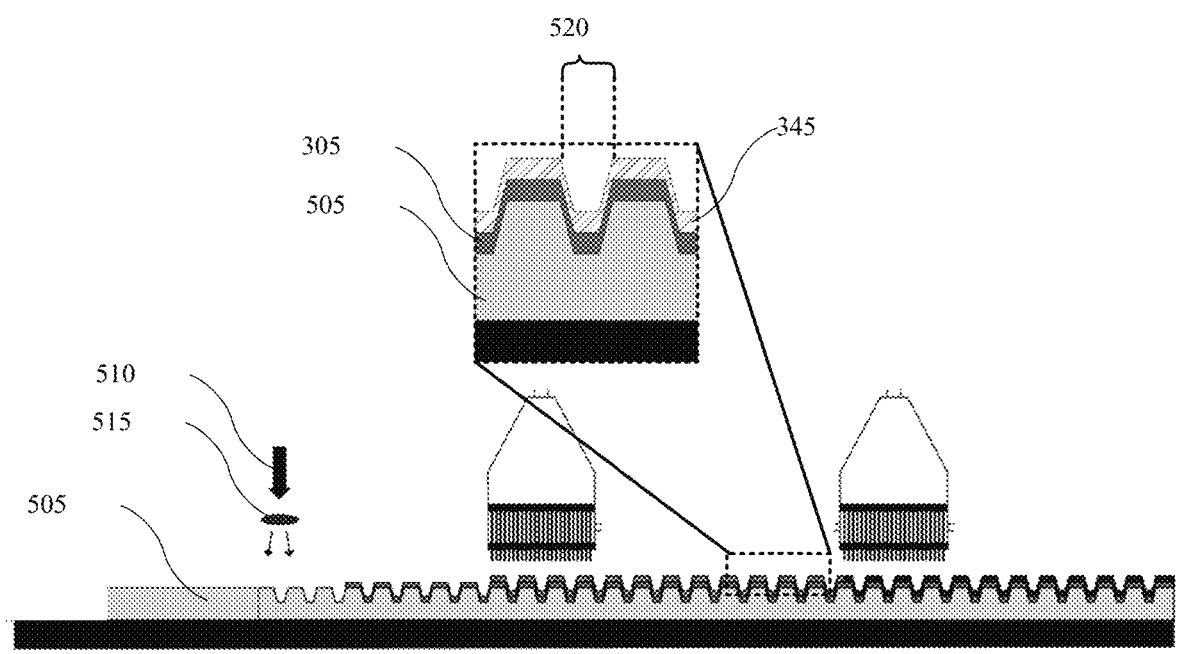
FIGS. 5A-5C show schematic views of an exemplary patterning system during operations in a deposition method according to some embodiments of the present technology.
Figure 5B:
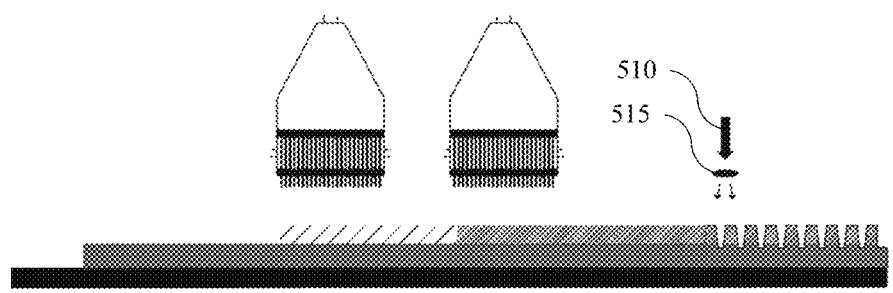
Figure 5C:
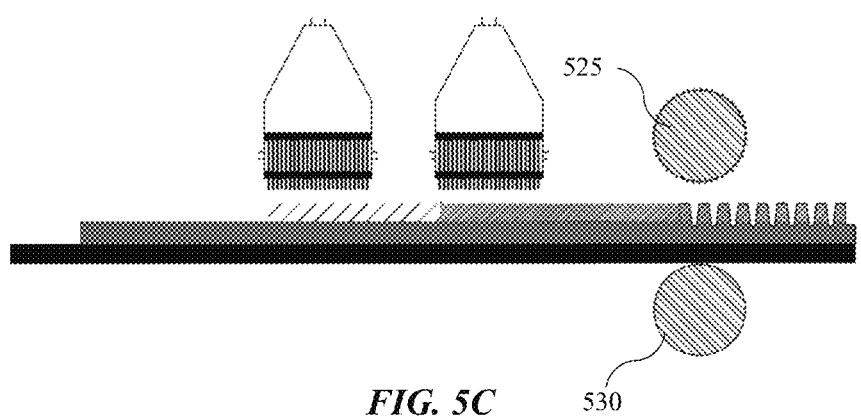

At one or more points during the method 200, operations may include patterning the material film 305 and/or the passivation layer 345, at operation 235. To that end, while method 200 as illustrated in FIG. 2 describes operations in a particular order, different order or timing may be implemented for operation 235, as illustrated in FIGS. 5A-5C. In some embodiments, patterning may include patterning the material film 305. As illustrated in FIG. 5A, a substrate 505 may be deposited onto the conductive substrate 310. The substrate may be or include a material compatible with deposition processes in a roll-to-roll fabrication system, as described in reference to FIG. 1. For example, the substrate 505 may be or include a Group IV or Group IV suboxide. The substrate 505 may be or include silicon or silicon oxide. Subsequently, the substrate 505 may be irradiated by a light beam 510. The light beam 510 may be or include a coherent light beam, such as a laser, that is selected to ablate the surface of the material film 305. For example, the light beam 510 may be generated by a pulsed laser source to ablate the surface of the substrate 505 and defining a plurality of recesses 520 in the surface of the substrate 505 film. The light beam 510 may be directed toward an optic 515, which may be or include a diffractive optical element. The optic 515 may shape the light beam 510 to remove material from the substrate 505 and define prismatic shaped recesses in the substrate 505 as the conductive substrate 310 advances past the position of the optic 515. In this way, the recesses 520 may serve as a patterned surface that will transfer the pattern into the material film 305 and into the passivation layer 345.

In some embodiments, the method 200 may include the operation 235 subsequent to operation 230. As illustrated in FIGS. 5B-5C, the method 200 may include patterning the passivation layer 345. As illustrated in FIG. 5B, the light beam 510 and the optic 515 may be positioned such that the conductive substrate 310 advances past the position of the optic 515 subsequent the formation of the passivation layer 345, such that the light beam 510 may remove material from the passivation layer 345 to define the recesses 520. The light beam 510 may be or include a pulsed laser beam configured to be absorbed by the passivation layer 345, such that the passivation layer 345 is ablated more than the material film 305. In this way, patterning the passivation layer 345 may reveal the material film 305 beneath the passivation layer 345.

Similarly, as illustrated in FIG. 5C, the operation 235 may include patterning the passivation layer 345 using one or more rollers integrated into the roll-to-roll system described in reference to FIG. 1. A first roller 525 may be machined with a negative of the pattern. For example, the first roller 525 may include a micro-needle array configured to transfer the pattern into the surface of the passivation layer 345 or the material film 305. For example, an application of pressure against the first roller 525 may transfer the pattern of recesses 520 into the passivation layer 345 and into the material film 305 beneath. In some embodiments, the pressure may be applied by supporting the conductive substrate 310 against the first roller 525 with a second roller 530, positioned substantially opposite the first roller 525. In this way, the force applied to the material film 305 or the passivation layer 345 may be controlled by the force applied by the first roller 525 to the second roller 530 or by the tension applied to the conductive substrate 310 by the first roller 525.

By utilizing methods and components according to embodiments of the present technology, material deposition or formation may be improved. By providing precursor gases to a substrate in a flexible substrate coating apparatus through showerheads configured to limit contamination by excess gas, overall performance and quality of deposited films may be improved. These improvements may include reduced waste of precursor gases, where gases can be recycled, and reduce contamination of sensitive films in earlier stages of deposition, such as metal films sensitive to oxidation. Additionally, patterning of substrates may improve device performance, for example, by situating surface active sites for dendrite formation within recesses in a passivation layer, which may limit the effect of dendrites on battery lifetime and operating performance. Additionally, incorporation of the techniques described herein into flexible substrate coating systems presents a significant improvement for process integration, providing improved processing capabilities, such as preparation of in-situ passivated metal films on conductive substrates.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of processing a lithium film, the method comprising:
   depositing a lithium film on a substrate, wherein the substrate is a Group IV suboxide;
   planarizing the lithium film, wherein planarizing the lithium film comprises laser planarization;
   translating the lithium film beneath a first showerhead;
   introducing an oxidizer gas and an inert carrier gas through the first showerhead onto the lithium film, wherein the oxidizer is provided at a flow rate below 0.1 sccm;
   forming an oxide monolayer on the lithium film, the oxide monolayer comprising the oxidizer gas adsorbed on the lithium film;
   translating the lithium film beneath a second showerhead after forming the oxide monolayer;
   introducing a second gas comprising a carbon source gas through the second showerhead onto the lithium film; and
   converting the oxide monolayer into a carbonate passivation layer through reaction of the oxide monolayer with the carbon source gas.

2. The method of claim 1, wherein the substrate is held under tension between two tensioning elements of a film deposition system.

3. The method of claim 1, wherein:
   the first showerhead comprises a first plurality of showerhead units oriented along a first axis;
   the second showerhead comprises a second plurality of showerhead units oriented parallel to the first axis and offset from the first showerhead by a first distance; and
   the method further comprising:
   translating the lithium film beneath the first showerhead comprises motion perpendicular to the first axis.

4. The method of claim 1, wherein the first showerhead and the second showerhead each comprise a plurality of inlets and a plurality of outlets in an arrangement, wherein the plurality of outlets are positioned to remove excess gas from a region between the plurality of outlets and the lithium film, and wherein an orientation of the plurality of outlets define a flow pattern limiting excess gas flow parallel to the lithium film external to the region.

5. The method of claim 1, further comprising:
   forming a pattern in a surface of the lithium film, the pattern defining a plurality of recesses in the surface of the lithium film.

6. The method of claim 1, further comprising:
   forming a pattern in the carbonate passivation layer, the pattern defining a plurality of recesses in the carbonate passivation layer, wherein the plurality of recesses reveal a surface of the lithium film.

7. The method of claim 1, wherein the oxidizer gas is present in an inert carrier gas at a concentration of greater than or about 1.0 ppm.

8. The method of claim 1, wherein the second gas further comprises an inert gas, and wherein the second gas includes carbon dioxide ($CO_2$) at greater than 40 vol. %.

9. The method of claim 1, wherein the oxidizer comprises water vapor ($H_2O$).

10. A method of processing a metal film comprising:
    forming an oxide monolayer on a metal film, the oxide monolayer comprising an oxidizer gas adsorbed on the metal film, wherein the oxide monolayer is formed from an oxidizer gas present in an inert carrier gas at a concentration of greater than or about 1.0 ppm, and wherein the oxidizer is provided at a flow rate below 0.1 sccm;

converting the oxide monolayer into a carbonate passivation layer through reaction of the oxide monolayer with a carbon source gas; and patterning the metal film with a pattern defining a plurality of recesses, wherein the pattern defines the plurality of recesses in the carbonate passivation layer, and wherein the plurality of recesses reveal a surface of the metal film.

11. The method of claim 10, wherein patterning the metal film comprises:

depositing a substrate layer onto a current collector;

forming the pattern in the substrate layer; and depositing the metal film on the substrate layer.

12. The method of claim 11, wherein forming the pattern in the substrate layer comprises ablating the substrate layer with a laser.

13. The method of claim 10, wherein the pattern is formed on the metal film after converting the oxide monolayer into the carbonate passivation layer, and wherein the plurality of recesses are defined in the carbonate passivation layer.

14. The method of claim 13, wherein patterning the metal film comprises:

emitting a light beam from a coherent light source;

receiving the light beam by a diffractive optical element, configured to shape and redirect the light beam toward the metal film; and irradiating the metal film at a plurality of positions corresponding to the pattern.

15. The method of claim 10, wherein patterning the metal film comprises:

advancing the metal film between two or more rollers, wherein:

a first roller of the two of more rollers comprises a micro-needle array, the micro-needle array configured to transfer the pattern into the metal film; and a second roller of the two or more rollers supports the metal film against the first roller.

16. The method of claim 10, wherein the metal film is formed on a substrate, and wherein the substrate is a Group IV suboxide.

* * * * *